(12) United States Patent
Chang et al.

(10) Patent No.: US 8,487,645 B2
(45) Date of Patent: Jul. 16, 2013

(54) THROUGH SILICON VIA TESTING STRUCTURE

(75) Inventors: Ming-Tung Chang, Hsinchu County (TW); Min-Hsiu Tsai, Zhubei (TW); Chih-Mou Tseng, Chiayi County (TW)

(73) Assignee: Global Unichip Corporation, Hsinchu (TW)

( * ) Notice: Subject to any disclaimer, the term of this patent is extended or adjusted under 35 U.S.C. 154(b) by 395 days.

(21) Appl. No.: 12/929,881

(22) Filed: Feb. 23, 2011

(65) Prior Publication Data

US 2012/0012841 A1 Jan. 19, 2012

(30) Foreign Application Priority Data

Jul. 13, 2010 (TW) .................................. 99122911 A (51) Int. Cl.
*G01R 31/26* (2006.01)

(52) U.S. Cl.
USPC ................................. 324/762.01; 324/762.02

(58) Field of Classification Search
USPC ............. 324/762.01–762.03, 762.05, 762.06, 324/763.01, 763.02, 537, 500, 755.11, 756.01–756.05, 756.07, 757.02, 757.03, 757.04, 324/757.05

See application file for complete search history.

(56) References Cited

U.S. PATENT DOCUMENTS 7,068,611 B2 * 6/2006 Bui ............................... 370/252

* cited by examiner

*Primary Examiner* — Hoai-An D Nguyen
(74) *Attorney, Agent, or Firm* — Bacon & Thomas, PLLC (57) ABSTRACT

A through-silicon via (TSV) testing structure is disclosed herein and includes a plurality of controllers, a plurality of transmitters and a plurality of receivers. The controllers are configured to output a first controlling signal and a second controlling signal. The transmitters are respectively connected to the output end of the through-silicon via and one of the controllers, and output a testing output signal in accordance with the first controlling signal and the second controlling signal. The receivers are respectively connected to the input end of the through-silicon via and another one of the controllers, and input a testing input signal in accordance with the first controlling signal and the second controlling signal.

24 Claims, 8 Drawing Sheets

C: controller   T: transceiver   R: receiver

|  | Mode0 Mode1 | Out0_0 Out0_1 Out1_0 Out1_1 |  |
|---|---|---|---|
| Function Mode | 0   0 | 0   1   0   1 |  |
| TSV Test Mode1 | 0   1 | 1   1   0   0 | First element in "Next Element Mode" |
| TSV Test Mode2 | 1   0 | 0   0   1   1 | First element in "To TSV Mode" |

|  | Mode0 | Mode1 |  |
|---|---|---|---|
| — — Function Path Mode | 0 | 1 | TSV<= From_fun |
| ······· Next Element Mode | 0/1 | 0 | TSV = CO |
| ------ To TSV Mode | 1 | 1 | TSV<= CI |

|  | Mode0 | Mode1 |  |
|---|---|---|---|
| — — Function Path Mode | 0 | 1 | To_fun<=TSV |
| ······· Next Element Mode | 0 | 0 | TSV=CO |
| ------ To TSV Mode | 1 | 1 | TSV<=CI |

Figure 5B

C: controller   T: transceiver   R: receiver

Figure 6A

C: controller    T: transceiver    R: receiver

Figure 6B

C: controller    T: transceiver    R: receiver

Figure 6C

THROUGH SILICON VIA TESTING STRUCTURE

BACKGROUND OF THE INVENTION

1. Field of the Invention

This invention relates to a through-silicon via (TSV) testing structure, particularly to a through-silicon via (TSV) testing structure with simplifying test procedure.

2. Description of the Prior Art

The system in package (SIP) is one of main packaging techniques at present, because the SIP is able to use more advanced off-line mounted way (such as through-silicon via (TSV) etc.) in semiconductor process. Due to the process miniaturization and limitation of dielectric material, the heap packaging technology of the three-dimensional (3D) stack packaging has already been considered as the key point for making high efficient chip with smaller size. The through-silicon via uses wafer stacking through vertical conduction, in order to reach the electric interconnection among the chips. The through-silicon via can provide shorter route and lower resistance and inductance than line connection, which is more suitable for the transmission of signal and electricity.

Figure 1:
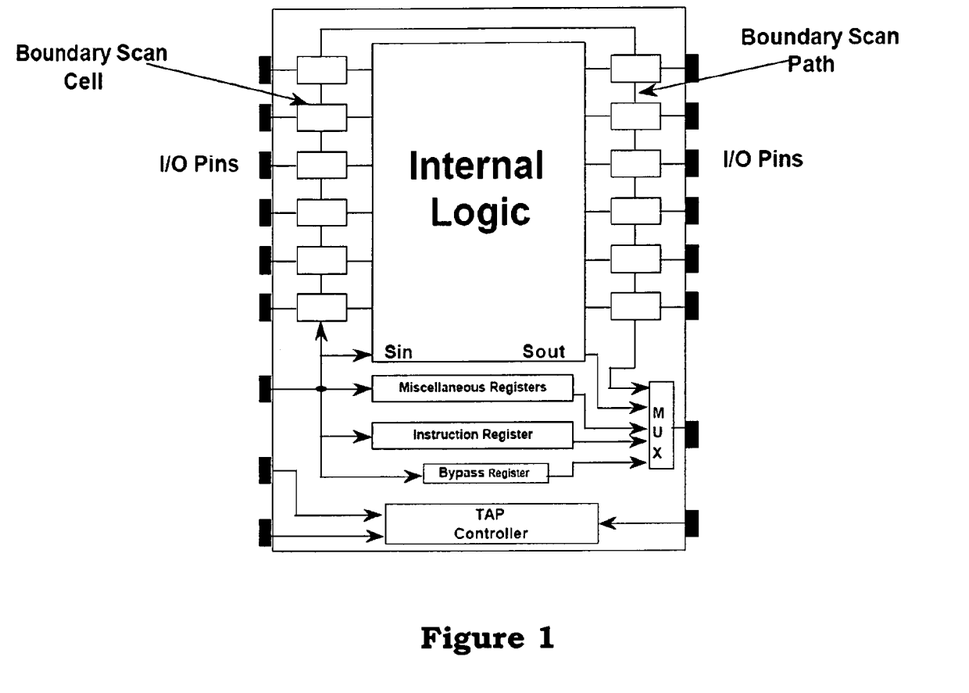
FIG. 1 shows the conventional Boundary-Scan (BSD) testing structure.

However, after the through-silicon via packaging is finished, it is necessary to carry out the test of system, in order to confirm whether the packaging is correct or not. The conventional through-silicon via packaging test utilizes the Boundary-Scan (BSD) technique to test through-silicon via, as shown in FIG. 1. However, the conventional Boundary-Scan test is very complicated, which needs several sequential and combination circuits, thus it needs more space for the test. On the other hand, it needs more instructions and more time to do Boundary-Scan test. The test timing is not efficient as well.

Therefore, according to the above-mentioned drawbacks, it is necessary to research and develop an innovative through-silicon via testing structure, so as to eliminate the complicated structure and test procedure, and further reduce the test time of packaging.

SUMMARY OF THE INVENTION

The purpose of this invention is to provide a through-silicon via (TSV) testing structure. According to the testing structure, it is able to simplify the test procedure and used elements.

Another purpose of this invention is to provide a through-silicon via testing structure for simplifying its testing structure without requiring many complicated control instructions.

According to the above-mentioned purpose, the invention discloses through-silicon via testing structure, comprising a plurality of controllers, a plurality of transmitters and a plurality of receivers. The controllers are configured to output a first controlling signal and a second controlling signal. The transmitters are respectively connected to the output end of the through-silicon via and one of the controllers, and output a testing output signal in accordance with the first controlling signal and the second controlling signal. The receivers are respectively connected to the input end of the through-silicon via and another one of the controllers, and input a testing input signal in accordance with the first controlling signal and the second controlling signal.

According to the above-mentioned purpose, the invention discloses through-silicon via testing structure, comprising a plurality of controllers, a plurality of transmitters and a plurality of receivers. The controllers are configured to output a first controlling signal and a second controlling signal. The transmitters are respectively connected to the output end of the through-silicon via and one of the controllers, and output a testing output signal in accordance with the first controlling signal and the second controlling signal. The receivers are respectively connected to the input end of the through-silicon via and another one of the controllers, and input a testing input signal in accordance with the first controlling signal and the second controlling signal. Among these, a controller combines a plurality of transmitters and a plurality of receivers to form a first connection direction control module, and another controller combines a plurality of transmitters and a plurality of receivers to form a second connection direction control module. The data can be transmitted from the first connection direction control module or the second connection direction control module.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will be described as follows in detail. However, except the following description, the invention can also be implemented in other embodiments widely. Furthermore, the scope of the invention is not limited by the embodiments. The latter scope of patent will be used as the basis. Moreover, in order to provide clearer description and more intelligible invention, the diagrams in Figures are not drawn in accordance with the relative size. Some sizes and other relevant scales have already been overstated. The unrelated detail parts are also not drawn totally, in order to simplify the diagrams.

Figure 2:
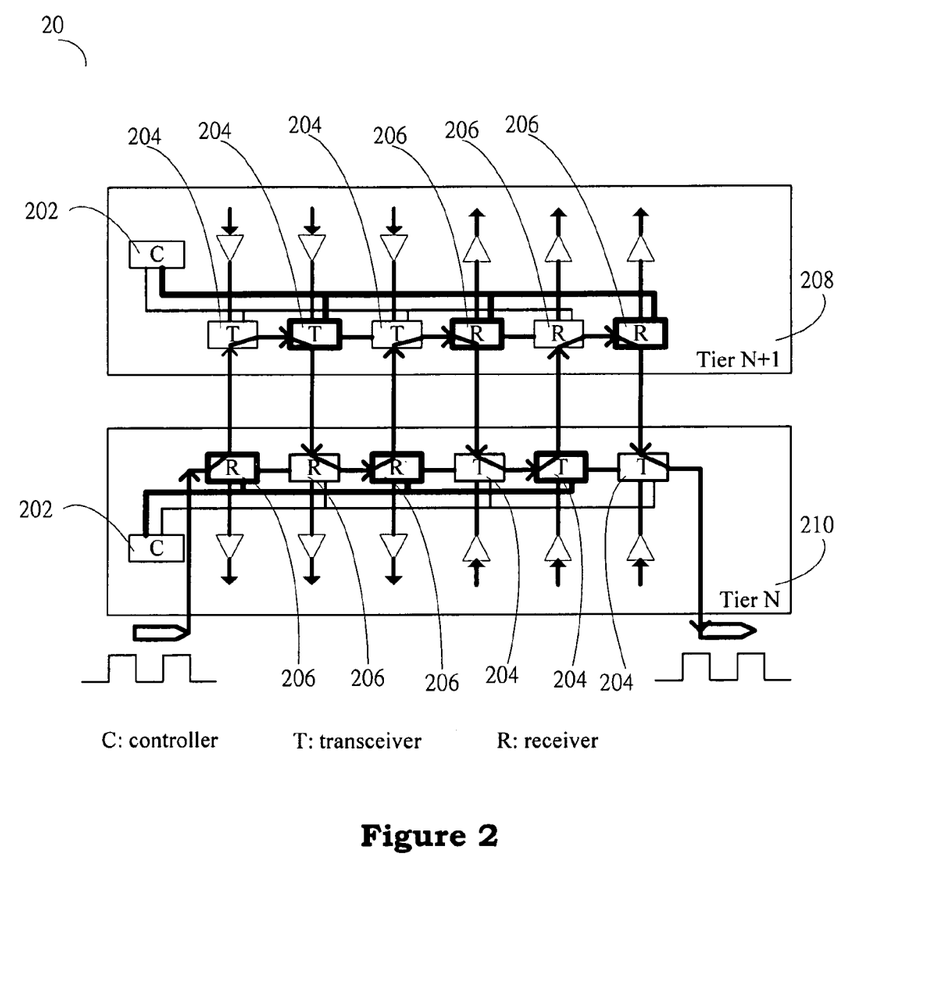
FIG. 2 shows the main element circuit diagram for the through-silicon via testing structure of this invention.

FIG. 2 shows the main element circuit diagram for the through-silicon via testing structure of the invention. The through-silicon via testing structure 20 includes a plurality of controllers 202, a plurality of transmitters 204 and a plurality of receivers 206 mainly. The first connection direction control module 208 and the second connection direction control module 210 are respectively composed of controller 202, a plurality of transmitters 204 and a plurality of receivers 206. Among these, the data can be respectively transmitted by the first connection direction control module 208 and the second connection direction control module 210. The direction of data signal transmitted by the first connection direction control module 208 is opposite to the direction of data signal transmitted by the second connection direction control module 210. The controllers 202 are configured to output a first controlling signal (mode0) 2022 and a second controlling signal (mode1) 2024. The controllers 202 can control the signal transmission of the transmitters 204 and the receivers 206 through the first controlling signal 2022 and the second controlling signal 2024. The transmitters 204 are respectively connected to the output end of the through-silicon via. The receivers 206 are respectively connected to the input end of the through-silicon via. The testing structure of the invention can judge whether the element to be tested is a normal element through comparing the testing signal of the transmitters 204 and the receivers 206 or not. Compared to the conventional through-silicon via testing structure with BSD, the through-silicon via testing structure 20 composed of the first connection direction control module 208 and the second connection direction control module 210 can simplify its testing structure greatly without requiring many complicated control instructions.

Figure 3A:
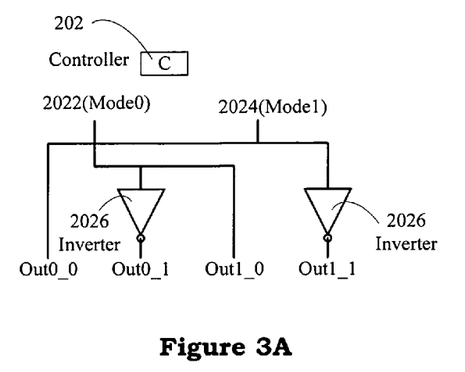
FIG. 3A is a graph illustrating the circuit for the controller of through-silicon via testing structure.

FIG. 3A is a graph illustrating the circuit diagram for the controller of through-silicon via testing structure. As shown in FIG. 3A, the controller 202 comprises first controlling signal (mode0) 2022, second controlling signal (mode1) 2024 and four output signals (out0_0, out0_1, out1_0 and out1_1). Inverter 2026 is respectively placed between the first controlling signal 2022 and output signal (out0_1) as well as the second controlling signal 2024 and output signal (out1_1). The first controlling signal 2022 and the second controlling signal 2024 are produced from the output signal via the circuit designed in FIG. 3A.

Figure 3B:
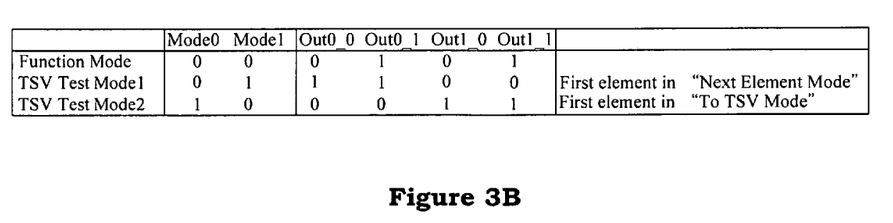
FIG. 3B shows the truth table for the signal of controller.

FIG. 3B shows the truth table for the signal of controller. As shown in FIG. 3B, when four output signals respectively are as 0101, the first controlling signal 2022 and the second controlling signal respectively are as 00, and the controller 202 is at the function mode. When four output signals respectively are as 1100, the first controlling signal 2022 and the second controlling signal respectively are as 01, and controller 202 is at the first through-silicon via test mode1. When four output signals respectively are as 0011, the first controlling signal 2022 and the second controlling signal respectively are as 01, and the controller 202 is at the second through-silicon via test mode2.

Figure 4A:
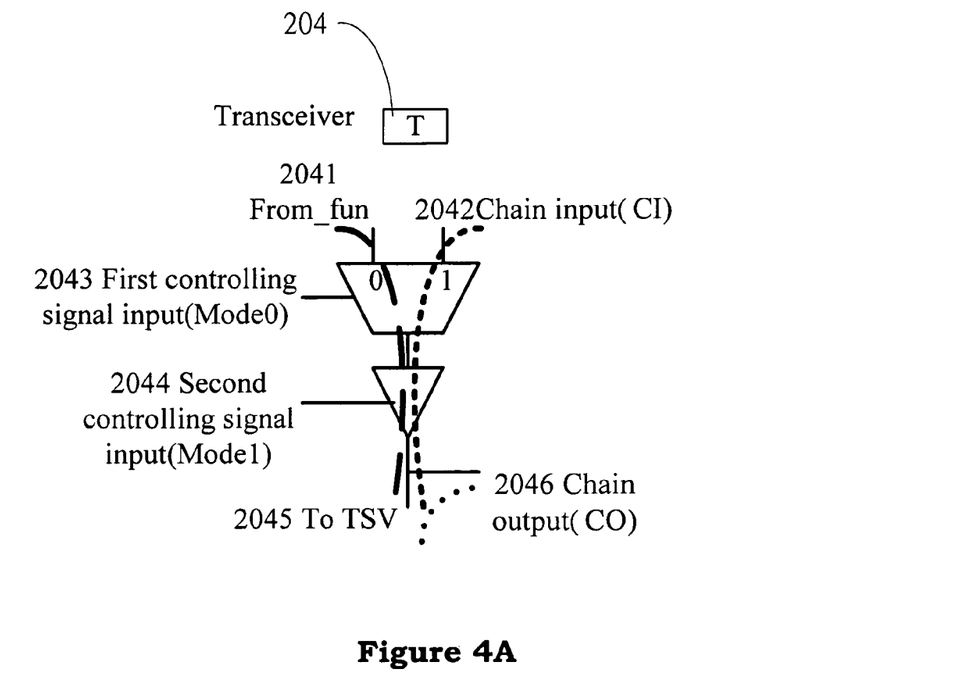
FIG. 4A shows the circuit for the transceiver of through-silicon via testing structure.

FIG. 4A shows the circuit diagram for the transceiver of through-silicon via testing structure. As shown in FIG. 4A, the transceiver 204 comprises four inputs (From_fun 2041, chain input (CI) 2042, first controlling signal input 2043 and second controlling signal input 2044) and two outputs (To TSV 2045 and chain output (CO) 2046). The first controlling signal input 2043 and the second controlling signal input 2044 are used to input the first controlling signal 2022 and the second controlling signal 2024, so as to control the transceiver 204 to transmit the data from the From_fun 2041, chain output 2046, or chain input 2042 to the To TSV 2045.

Figure 4B:
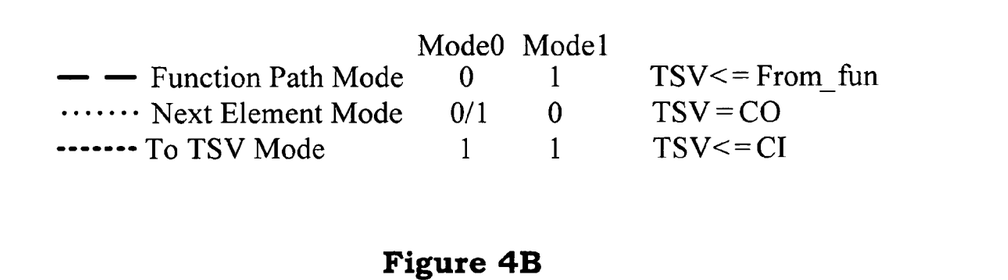
FIG. 4B shows the relation between the transceiver and the controlling signal.

FIG. 4B shows the relation between the transceiver and the controlling signal. As shown in FIG. 4B, when the first controlling signal 2022 and the second controlling signal 2024 respectively are 01, and the transceiver 204 is at the functional path mode. The data will be transmitted from the From_fun 2041 to the To TSV 2045. When the first controlling signal 2022 and the second controlling signal 2024 respectively are as 00 or 10, and the transceiver 204 is at the next element mode. The data will be transmitted from the chain output 2046 to the To TSV 2045. When the first controlling signal 2022 and the second controlling signal 2024 are respectively 11, the transceiver 204 is at the to TSV mode. The data will be transmitted from the chain input 2042 to the To TSV 2045.

Figure 5A:
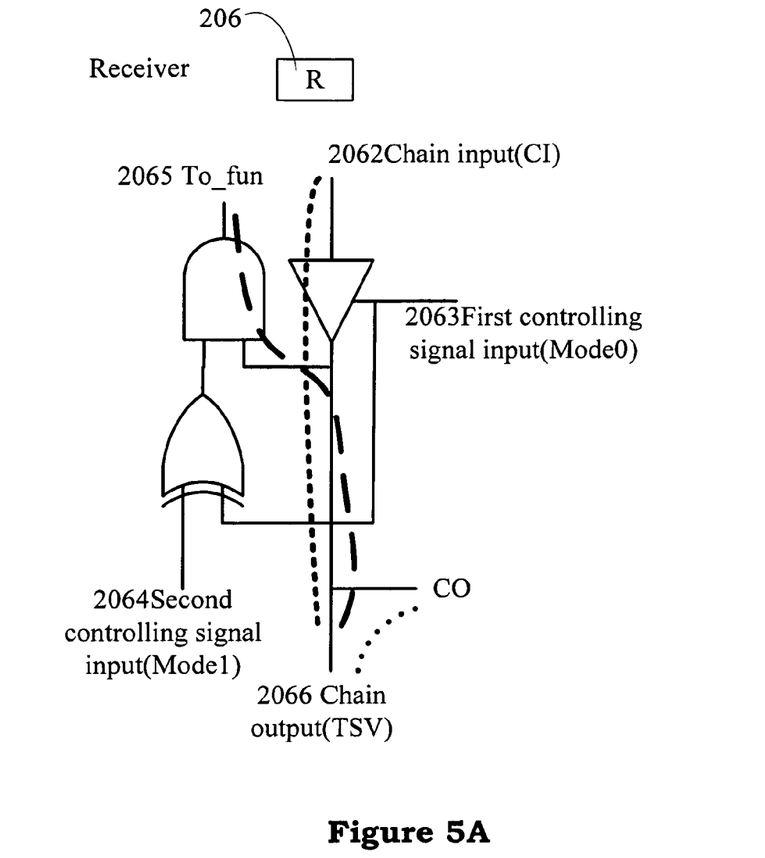
FIG. 5A shows the circuit for the receiver of through-silicon via testing structure.

FIG. 5A shows the circuit for the receiver of through-silicon via testing structure. As shown in FIG. 4B, the receiver 206 includes four inputs (From TSV 2061, chain input (CI) 2062, first controlling signal input 2063 and second controlling signal input 2064) and two outputs (To_fun 2065 and chain output (CO) 2066). The first controlling signal input 2063 and the second controlling signal input 2064 are used to input the first controlling signal 2022 and the second controlling signal 2024, so as to control the transceiver 204 to transmit the data from the chain input 2062 or chain output 2066, or From TSV 2061 to the To_fun 2065.

Figure 5B:
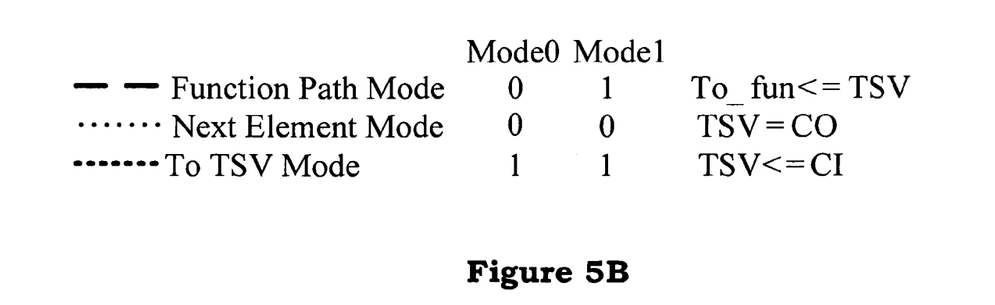
FIG. 5B shows the relation between the receiver and the controlling signal.

FIG. 5B shows the relation between the receiver and the controlling signal. As shown in FIG. 5B, when the first controlling signal 2022 and the second controlling signal 2024 respectively are as 01, the receiver 206 is at the functional path mode. The data will be transmitted from the From TSV 2061 to the To_fun 2065. When the first controlling signal 2022 and the second controlling signal 2024 respectively are as 00, and the receiver 206 is at the next element mode. The data will be transmitted from the chain output 2066 to the From TSV 2061. When the first controlling signal 2022 and the second controlling signal 2024 respectively are as 11, then the receiver 206 is at the to TSV mode. The data will be transmitted from the chain input 2062 to the From TSV 2061.

Figure 6A:
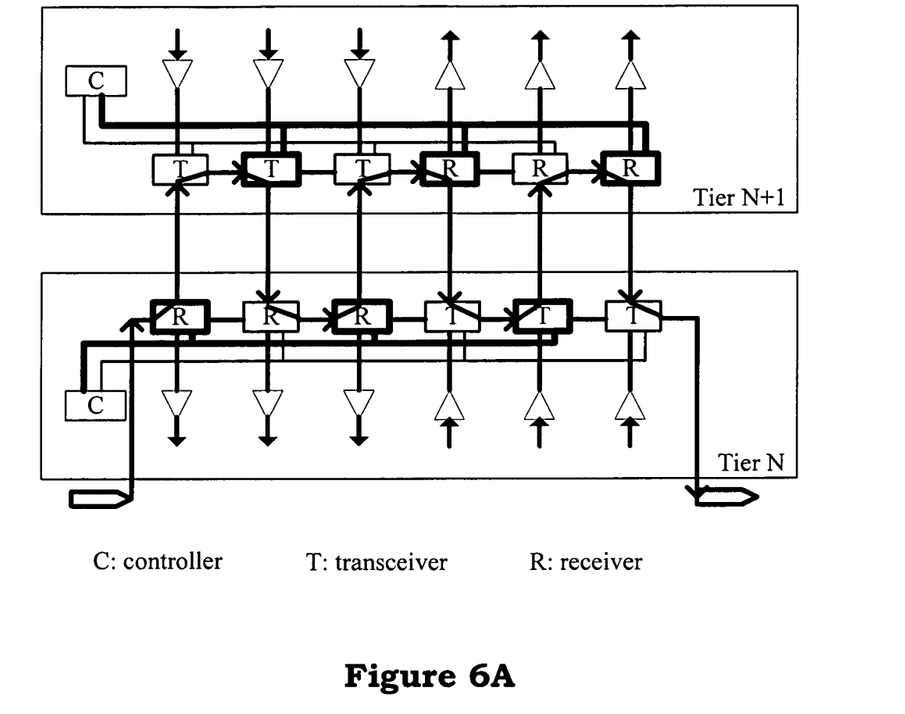
FIG. 6A to FIG. 6C are graphs illustrating different embodiments for the through-silicon via testing structure of the invention.
Figure 6B:
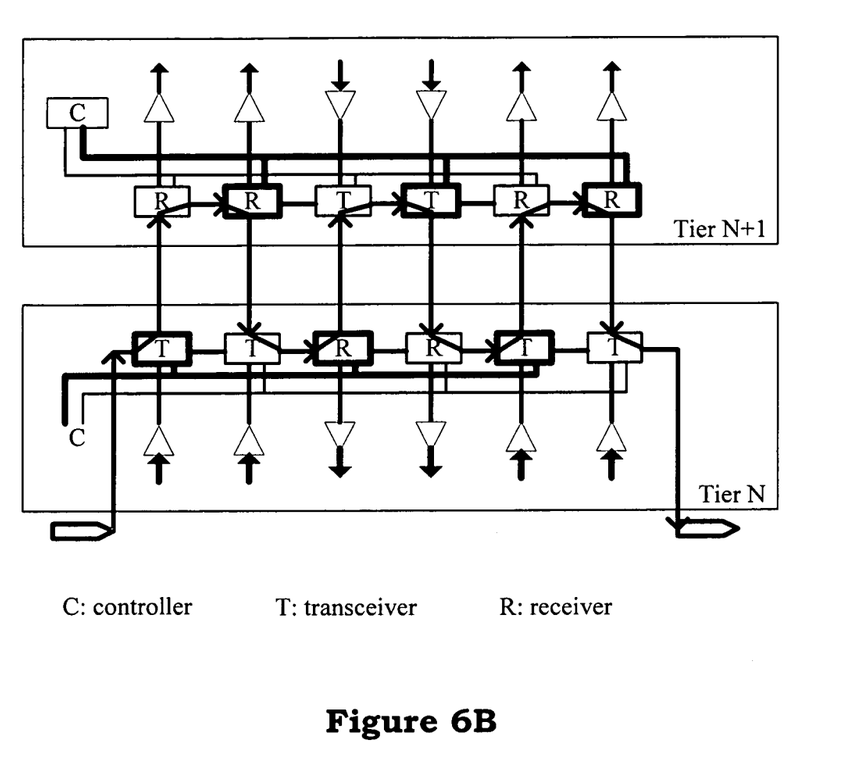
Figure 6C:
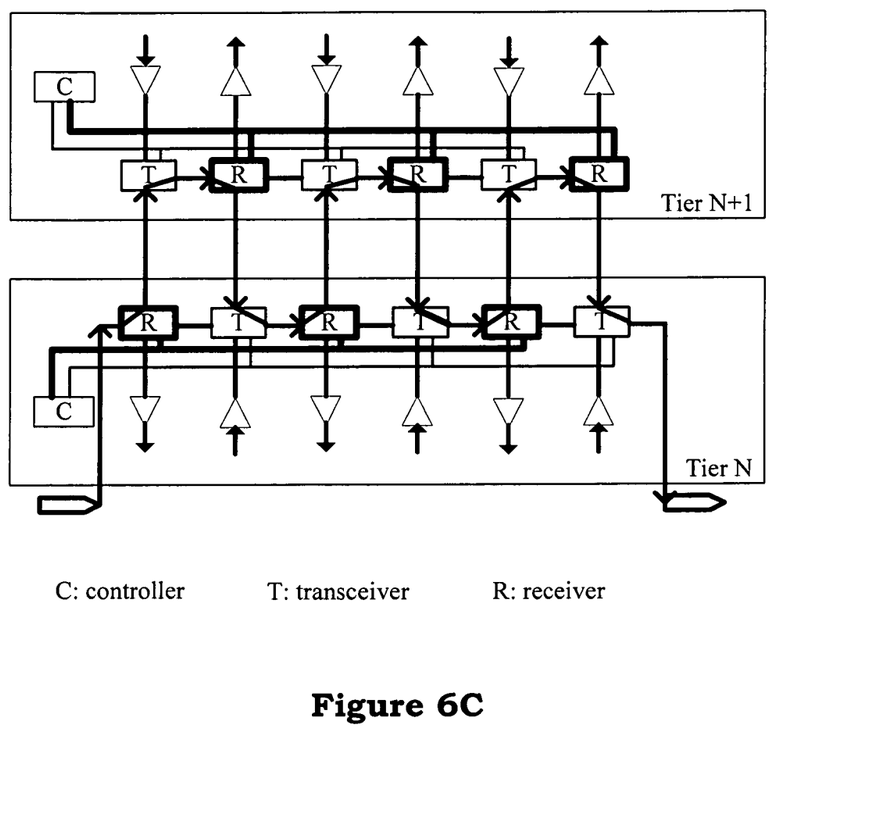

FIG. 6A to FIG. 6C are graphs illustrating different embodiments for the TSV testing structure of the invention. As shown in FIG. 6A to FIG. 6C, there are different arrangement ways for the TSV testing structure 20 of the invention in different embodiments. As shown in FIG. 6A to FIG. 6C, in the first connection direction control module 208, the controls 202 are respectively connected to three, two, or one transceiver 204 first, then are respectively connected to three, two, or one receiver 206. In the second connection direction control module 210, the controls 202 are respectively connected to three, two, or one receiver 206 first, then are respectively connected to three, two, or one transceiver 204. It is obvious that the transceiver 204 and the receiver 206 for the through-silicon via testing structure 20 of the invention may have different arrangement ways. The change of arrangement way will not influence the result of through-silicon via testing. Finally, the transceiver 204 and the receiver 206 are used to connect different level of through-silicon via. Assume the input signal being as 0101, if there in no defect of through-silicon via, the output signal (CO) will be shown as 0101.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:
1. A through-silicon via testing structure, comprising:
a plurality of controllers, outputting a first controlling signal and a second controlling signal;
a plurality of transmitters, being respectively connected to a plurality of output ends of a through-silicon via and one of the plurality of controllers, and outputting a testing output signal in accordance with the first controlling signal and the second controlling signal; and
a plurality of receivers, being respectively connected to a plurality of input ends of the through-silicon via and another one of the plurality of controllers, and inputting a testing input signal in accordance with the first controlling signal and the second controlling signal.

2. The through-silicon via testing structure according to claim 1, wherein outputs of a first controlling signal and a second controlling signal being controlled at a function mode, a first through-silicon via test mode1 and a second through-silicon via test mode2 via four output signals of the controller.

3. The through-silicon via testing structure according to claim 2, wherein the transceiver comprises a From_fun, a chain input, a first controlling signal input, a second controlling signal input, a To TSV and a chain output.

4. The through-silicon via testing structure according to claim 3, wherein the receiver comprises a From TSV, a chain input, a first controlling signal input, a second controlling signal input, a To_fun and a chain output.

5. The through-silicon via testing structure according to claim 4, wherein the first controlling signal and the second controlling signal control a transceiver and a receiver at a functional path mode, a next element mode and a to TSV mode.

6. The through-silicon via testing structure according to claim 5, wherein when the receiver being at a functional path mode, a data transmits from a From_fun to a To TSV.

7. The through-silicon via testing structure according to claim 6, wherein when the receiver being at a functional path mode, a data transmits from a To TSV to a To_fun.

8. The through-silicon via testing structure according to claim 7, wherein when the transceiver being at a next element mode, a data transmits from a chain output to a To TSV.

9. The through-silicon via testing structure according to claim 8, wherein when the receiver being at a next element mode, the data transmits from a chain output to a From TSV.

10. The through-silicon via testing structure according to claim 9, wherein when the transceiver being at a to TSV mode, a data transmits from a chain input to a To TSV.

11. The through-silicon via testing structure according to claim 10, wherein when the receiver being at a to TSV mode, a data transmits from a chain input to a To TSV.

12. The through-silicon via testing structure according to claim 10, wherein if an input testing signal of a receiver and an output testing signal of a transceiver being the same, there is no defect of through-silicon via.

13. A through-silicon via testing structure, comprising:
a plurality of controllers, outputting a first controlling signal and a second controlling signal;
a plurality of transmitters, being respectively connected to a plurality of output ends of a through-silicon via and one of the plurality of controllers, and outputting a testing output signal in accordance with the first controlling signal and the second controlling signal; and
a plurality of receivers, being respectively connected to a plurality input ends of the through-silicon via and another one of the plurality of controllers, and inputting a testing input signal in accordance with the first controlling signal and the second controlling signal; wherein a controller combining a plurality of transmitters and a plurality of receivers to form a first connection direction control module, and another of the plurality of controllers combining a plurality of transmitters and a plurality of receivers to form a second connection direction control module, the data being transmitted from the first connection direction control module or the second connection direction control module.

14. The through-silicon via testing structure according to claim 13, wherein outputs of a first controlling signal and a second controlling signal being controlled at a function mode, a first through-silicon via test mode1 and a second through-silicon via test mode2 via four output signals of the controller.

15. The through-silicon via testing structure according to claim 14, wherein the transceiver comprises a From_fun, a chain input, a first controlling signal input, a second controlling signal input, a To TSV and a chain output.

16. The through-silicon via testing structure according to claim 15, wherein the receiver comprises a From TSV, a chain input, a first controlling signal input, a second controlling signal input, a To_fun and a chain output.

17. The through-silicon via testing structure according to claim 16, wherein the first controlling signal and the second controlling signal control the transceiver and a receiver at a functional path mode, a next element mode and a to through-silicon via mode.

18. The through-silicon via testing structure according to claim 17, wherein when the receiver being at a functional path mode, a data transmits from the From_fun to the To TSV.

19. The through-silicon via testing structure according to claim 18, wherein when the receiver being at a functional path mode, a data transmits from a To TSV to a To_fun.

20. The through-silicon via testing structure according to claim 19, wherein when a transceiver being at a next element mode, a data transmits from a chain output to a To TSV.

21. The through-silicon via testing structure according to claim 20, wherein when the receiver being at a next element mode, a data transmits from a chain output to a From TSV.

22. The through-silicon via testing structure according to claim 21, wherein when a transceiver is at a to TSV mode, the data transmits from a chain input to a To TSV.

23. The through-silicon via testing structure according to claim 22, wherein when a receiver being at a to TSV mode, a data transmits from a chain input to a To TSV.

24. The through-silicon via testing structure according to claim 23, wherein if an input testing signal of a receiver and an output testing signal of a transceiver being the same, there is no defect of through-silicon via.

* * * * *